(12) United States Patent
Nishizawa et al.

(10) Patent No.: US 7,391,448 B2
(45) Date of Patent: Jun. 24, 2008

(54) IMAGING DEVICE

(75) Inventors: Tsutomu Nishizawa, Kawasaki (JP); Yoshizo Mori, Odawara (JP)

(73) Assignee: Nikon Corporation, Tokyo (JP)

( * ) Notice: Subject to any disclaimer, the term of this patent is extended or adjusted under 35 U.S.C. 154(b) by 700 days.

(21) Appl. No.: 10/747,950

(22) Filed: Dec. 31, 2003

(65) Prior Publication Data
US 2004/0150729 A1 Aug. 5, 2004

(30) Foreign Application Priority Data
Jan. 16, 2003 (JP) .............................. 2003-007902

(51) Int. Cl.
H04N 9/64 (2006.01)

(52) U.S. Cl. ...................................... 348/243
(58) Field of Classification Search ................. 348/243, 348/248, 241, 231.99, 244
See application file for complete search history.

(56) References Cited

U.S. PATENT DOCUMENTS

| 5,132,801 A | 7/1992 | Yamano |
| 5,278,658 A | 1/1994 | Takase |
| 6,101,287 A | 8/2000 | Corum et al. |
| 6,992,712 B2 * | 1/2006 | Yoshida ....................... 348/243 |

FOREIGN PATENT DOCUMENTS

| JP | A 7-236093 | 9/1995 |
| WO | WO 99/62023 | 12/1999 |

* cited by examiner

Primary Examiner—Tuan Ho
(74) Attorney, Agent, or Firm—Oliff & Berridge, PLC

(57) ABSTRACT

An object of the present invention is to provide an imaging device which can reliably correct dark current components that locally occur in an imaging sensor, such as those caused by an FDA. The imaging device includes: a storage unit which pre-stores information representing a relation between one of dark current components and an output signal of an optical black pixel arranged in a predetermined optical black area on an imaging sensor, the dark current components being superimposed on pixel signals of effective pixels, respectively, arranged in a predetermined effective pixel area on the imaging sensor; a dark current obtaining unit which obtains dark current components based on both the information stored in the storage unit and output signal of the optical black pixel; and a correcting unit which corrects the dark current components obtained by the dark current obtaining unit according to the pixel signals.

6 Claims, 11 Drawing Sheets

Fig. 2
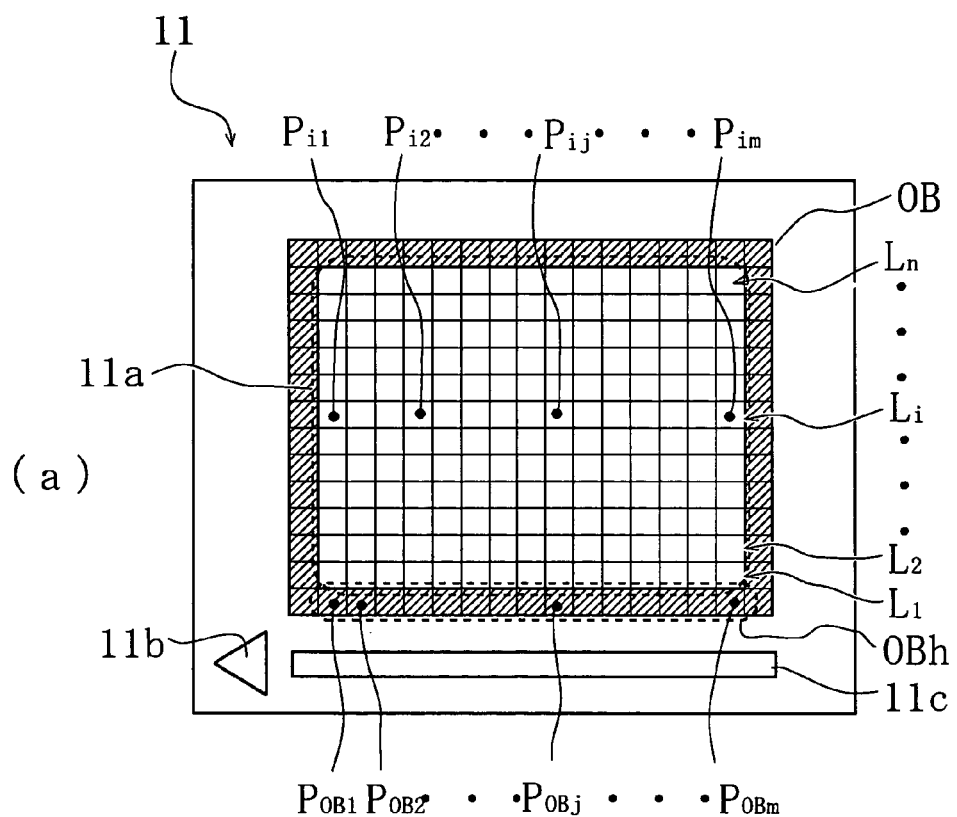
(a)
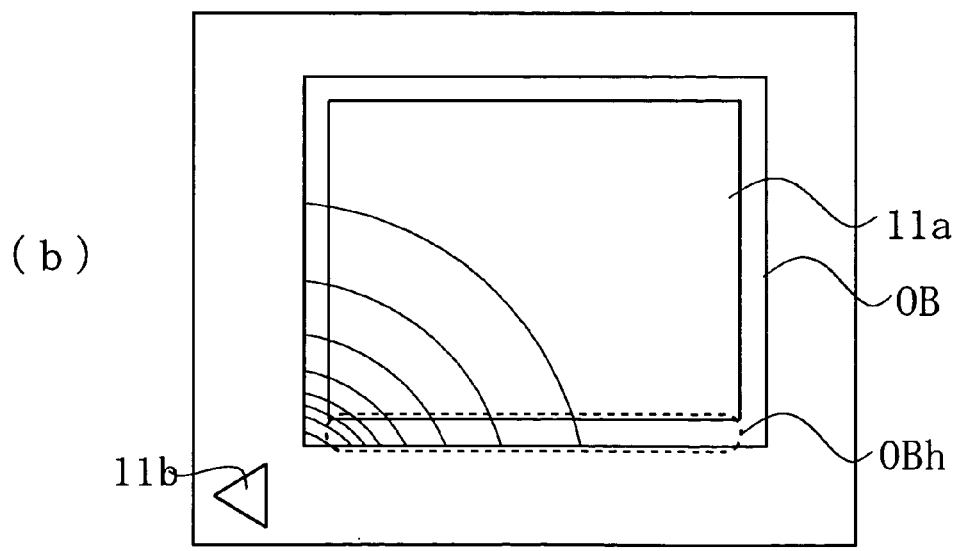
(b)

IMAGING DEVICE

CROSS-REFERENCE TO RELATED APPLICATIONS

This application is based upon and claims the benefit of priority from the prior Japanese Patent Application No. 2003-007902, filed on Jan. 16, 2003, the entire contents of which are incorporated herein by reference.

BACKGROUND OF THE INVENTION

1. Field of the Invention

The present invention relates to an imaging device equipped with an imaging sensor.

2. Description of the Related Art

Dark current components that are superimposed on pixel signals of an imaging sensor equipped in an electronic camera are corrected by a signal processing circuit in the electronic camera. So far, many types of correcting methods have been proposed Japanese Unexamined Patent Application Publication No. Hei 7-236093, and so forth).

However, the conventional correcting methods are based on the assumption that dark current components of each pixel outputs of an imaging sensor are almost constant. Thus, dark current components caused by an FDA cannot be corrected reliably.

Here, the FDA is an abbreviation of Floating Diffusion Amplifier that is disposed at an output end of an imaging sensor.

To cause the FDA to operate, it is necessary to apply a bias current thereto. However, when a current is applied to the FDA, it generates heat.

When the FDA generates heat and in particular electric charge accumulation time is long (30 seconds or longer), dark current components that are ignorable are superimposed on the pixel signals of the imaging sensor.

However, since heat radially spreads from the FDA, the amounts of the dark currents differ depend on the positions of the pixels. Therefore, the dark current components that occur in the imaging sensor caused by the FDA are local.

The dark current components that locally occur cannot be corrected reliably by the conventional correcting methods.

To decrease the dark current components that locally occur, a technology for temporally suppressing the bias current to be applied to the FDA in the case where the electric charge accumulation time of the imaging sensor is long has been proposed. However, since the technology is incapable of completely suppressing heat generation, it is not sufficient to reliably correct dark current components.

SUMMARY OF THE INVENTION

Therefore, an object of the present invention is to provide an imaging device which can reliably correct even dark current components that locally occur on an imaging sensor like those caused by the FDA.

An imaging device according to the present invention includes: a storage unit which pre-stores information representing a relation between one of dark current components and an output signal of an optical black pixel arranged in a predetermined optical black area on an imaging sensor, the dark current components are superimposed on pixel signals of effective pixels, respectively, arranged in a predetermined effective pixel area on the imaging sensor; a dark current obtaining unit which obtains dark current components superimposed on pixel signals of the respective effective pixels based on both the information stored in the storage unit and output signal of the optical black pixel; and a correcting unit which corrects the dark current components obtained by the dark current obtaining unit according to the pixel signals.

Therefore, the dark current components that locally occur on the imaging sensor are reliably corrected.

Preferably, the information stored in the storage unit is information representing a ratio of the one of dark current components to the output signal every one of lines of the effective pixel area.

Thus, the capacity of the storage unit can be decreased. In addition, the calculation (in this example, integrating) for correcting the dark current components is simple.

In addition, preferably, the information stored in the storage unit is information representing a difference between the one of dark current components and the output signal every one of lines of the effective pixel area.

Thus, the capacity of the storage unit can be decreased. In addition, the calculation (in this example, subtraction) for correcting the dark current components is simple.

In addition, preferably, the information stored in the storage unit is information representing a position of the optical black pixel in the optical black area every one of the effective pixels in the effective pixel area. The optical black pixel outputs an output signal having a value equal to the one of dark current components.

Thus, although the capacity of the storage unit becomes large, the accuracy of the correction becomes high.

In addition, preferably, the optical black area is composed of the optical black pixel for at least one line from which the output signal is read prior to the pixel signals of the top line of the effective pixel area.

Thus, the dark currents can be corrected in real time.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 2(a) and FIG. 2(b) are schematic diagrams describing a CCD imaging sensor 11;

DESCRIPTION OF THE PREFERRED EMBODIMENTS

Next, with reference to the accompanying drawings, embodiments of the present invention will be described.

First Embodiment

With reference to FIG. 1, FIG. 2, FIG. 3, FIG. 4, and FIG. 5, the first embodiment of the present invention will be described.

The first embodiment is directed to an electronic camera (imaging device) according to the present invention.

Figure 1:
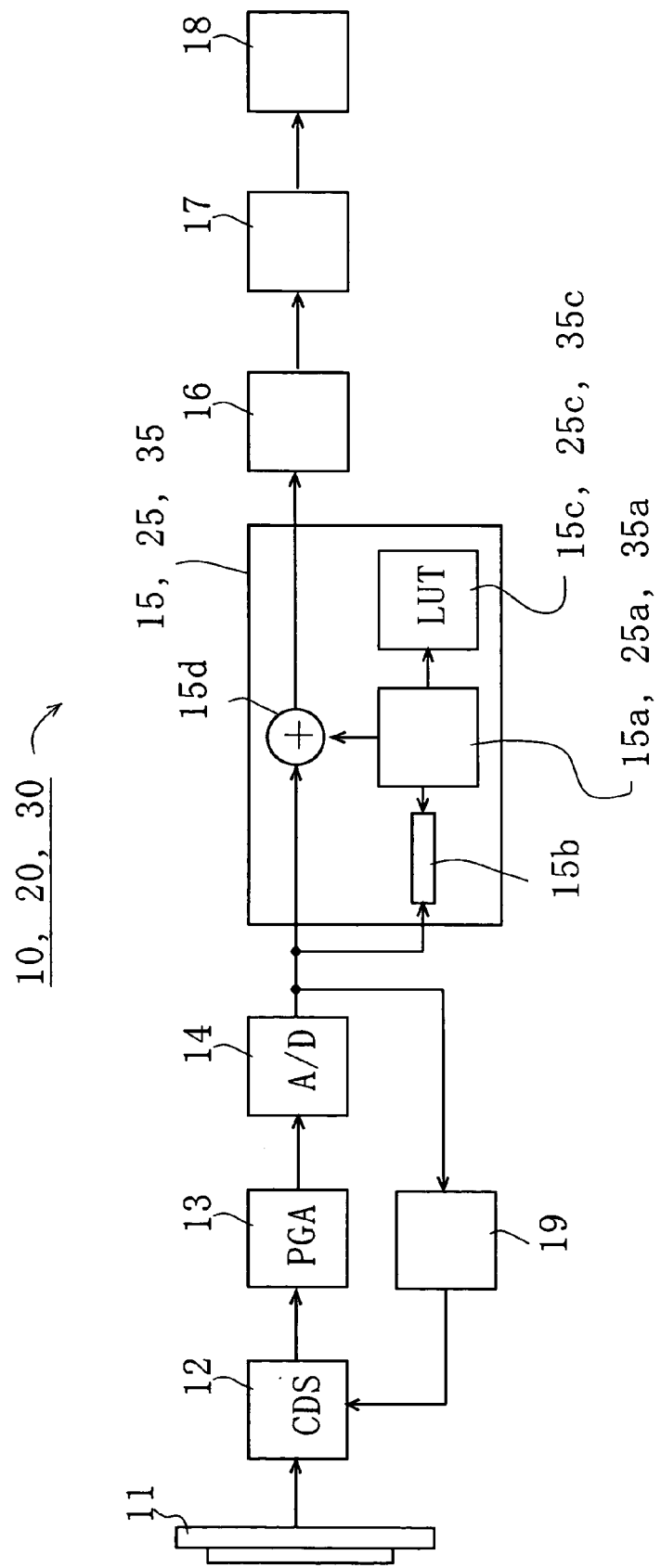
FIG. 1 is a schematic diagram showing a structure of an electronic camera according to a first embodiment (a second embodiment and a third embodiment) of the present invention.

FIG. 1 is a schematic diagram showing a structure of the electronic camera according to the first embodiment (the second embodiment and the third embodiment that will be described later).

The electronic camera 10 includes a Charge Coupled Device (CCD) imaging sensor 11, a Correlated Double Sampling circuit (CDS) 12, a Programmable Gain Amplifier (PGA) 13, an Analog to Digital converter (A/D) 14, a dark current correcting circuit 15, a signal processing circuit 16, an image processing circuit 17, an image memory 18, and an offset correcting circuit 19. An image of an object formed by a lens (not shown) is formed on the CCD imaging sensor 11.

Pixel signals that are successively output from the CCD imaging sensor 11 are sent to the correlated double sampling circuit 12, the programmable gain amplifier 13, the A/D converter 14, the dark current correcting circuit 15, and the signal processing circuit 16 and successively processed thereby, respectively. Thereafter, each pixel signal is processed in units of one frame by the image processing circuit 17, and then stored in the image memory 18.

Among those portions, the dark current correcting circuit 15 (which will be described later in detail) is a feature portion of the electronic camera 10 according to the present embodiment.

The offset correcting circuit 19 performs an offset correction for each pixel signal in one frame almost uniformly.

FIGS. 2(a) and 2(b) are schematic diagrams describing the CCD imaging sensor 11.

As shown in FIG. 2(a), an effective pixel area 11a, an optical black area OB, a floating diffusion amplifier (FDA) 11b, and a horizontally transferring CCD 11c are arranged on the CCD imaging sensor 11 (a vertically transferring CCD in the effective pixel area 11a is not shown).

Pixel signals $S_{ij}$ (i=1, . . . , n, j=1, . . . , m) of respective effective pixels $P_{ij}$ in the effective pixel area 11a are successively read through the horizontally transferring CCD 11c and the FDA 11b.

Meanwhile, "i" represents a line number starting from 1 and ends with n, whereas "j" represents a pixel position number in the line, starting from 1 and ends with m.

Now, the vertical optical black portion OBh shown in FIG. 2(a) will be considered.

The vertical optical black portion OBh is composed of optical black pixels $P_{OBj}$ (j=1, . . . m) for one line that are arranged closer to the horizontally transferring CCD 11c than the top line $L_1$ of the effective pixel area 11a.

Output signals $S_{OBj}$ (j=1, . . . , m) of these optical black pixels $P_{OBj}$ (j=1, . . . , m) are also successively read through the horizontally transferring CCD 11c and the FDA 11b.

The output signals $S_{OBj}$ (j=1, . . . , m) of the vertical optical black portion OBh arranged in this position are read before the pixel signals $S_{ij}$ (j=1, . . . , m) of the top line $L_1$.

As shown with concentric circle curves in FIG. 2(b), the vertical optical black portion OBh is affected by heat of the FDA 11b like the effective pixel area 11a.

Thus, based on the output signals $S_{OBj}$ (j=1, . . . , m) of the vertical optical black portion OBh, dark current components that locally occur in the effective pixel area 11a, namely, dark current components $D_{ij}$ (i=1, . . . , n, j=1, . . . , m) that are superimposed on the pixel signals $S_{ij}$ (i=1, . . . , n, j=1, . . . , m), respectively, can be obtained.

Figure 3:
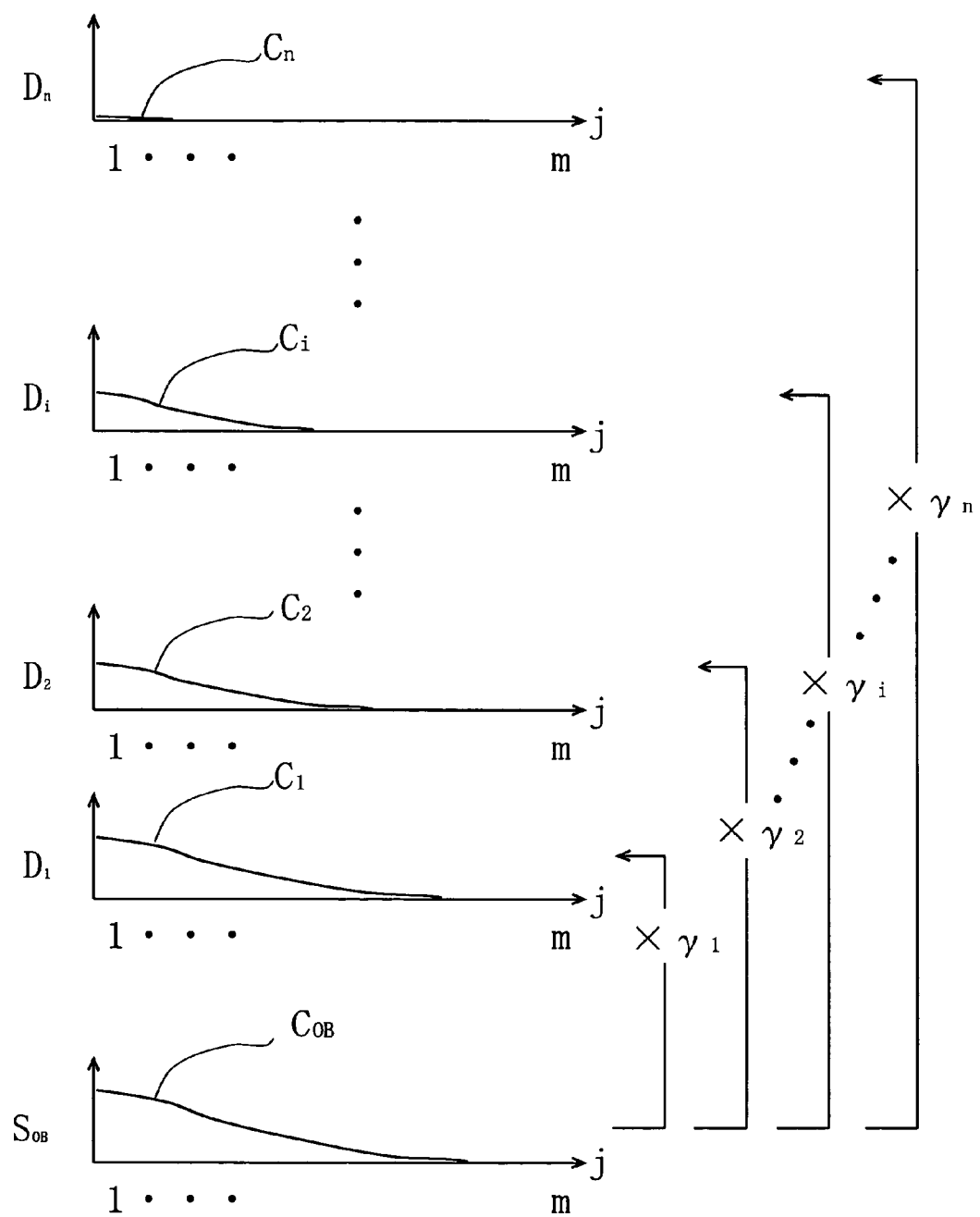
FIG. 3 is a schematic diagram showing respective pixel signals $S_{ij}$ (namely, dark current components $D_{ij}$) (i=1, . . . , n, j=1, . . . , m) of lines $L_i$ and respective output signals $S_{OBj}$ (j=1, . . . , m) of a vertical optical black portion OBh in the case where an FDA 11b is generating heat, insulating outer light.

FIG. 3 is a schematic diagram showing pixel signals $S_{ij}$ (namely, dark current components $D_{ij}$) (i=1, . . . , n, j=1, . . . , m) of respective lines $L_i$ (i=1, . . . , n) and output signals $S_{OBj}$ (=1, . . . , n, 1, . . . , m) of the vertical optical black portion OBh in the case where the FDA 11b generates heat, insulating outer light.

As is clear from FIG. 3, the amounts of dark current components $D_{ij}$ differ among lines. However, curves $C_i$ (i=1, . . . , n) of the dark current component $D_{ij}$ (j=1, . . . , m) of lines $L_i$ are correlated with curves $C_{OB}$ of the output signals $S_{OBj}$ (j=1, . . . , m) of the vertical optical black portion OBh.

According to the present embodiment, it is assumed that there are proportional relations between the curves $C_i$ (i=1, . . . , n) and the curves $C_{OB}$, respectively.

In this case, with the output signals $S_{OBj}$ (j=1, . . . , m) and coefficients $y_i$ predetermined for the line $L_i$, the dark current components $D_{ij}$ (j=1, . . . , m) of the lines $L_i$ are obtained by the following formula (1).

$$D_{ij}=y_i \times S_{OBj}(j=1,\ldots,m) \quad (1)$$

Figure 4:
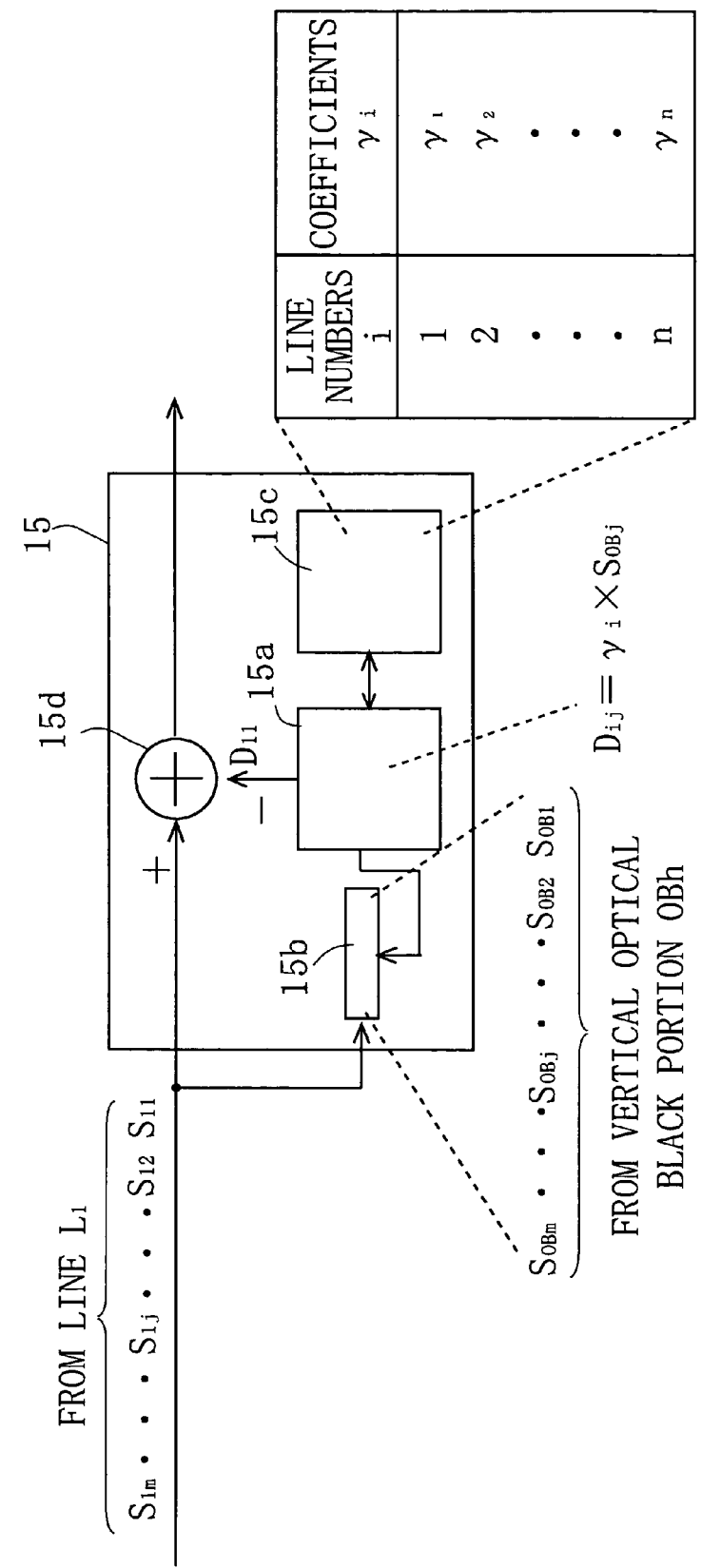
FIG. 4 is a schematic diagram showing a structure of a dark current correcting circuit 15.

FIG. 4 is a schematic diagram showing a structure of the dark current correcting circuit 15.

Figure 5:
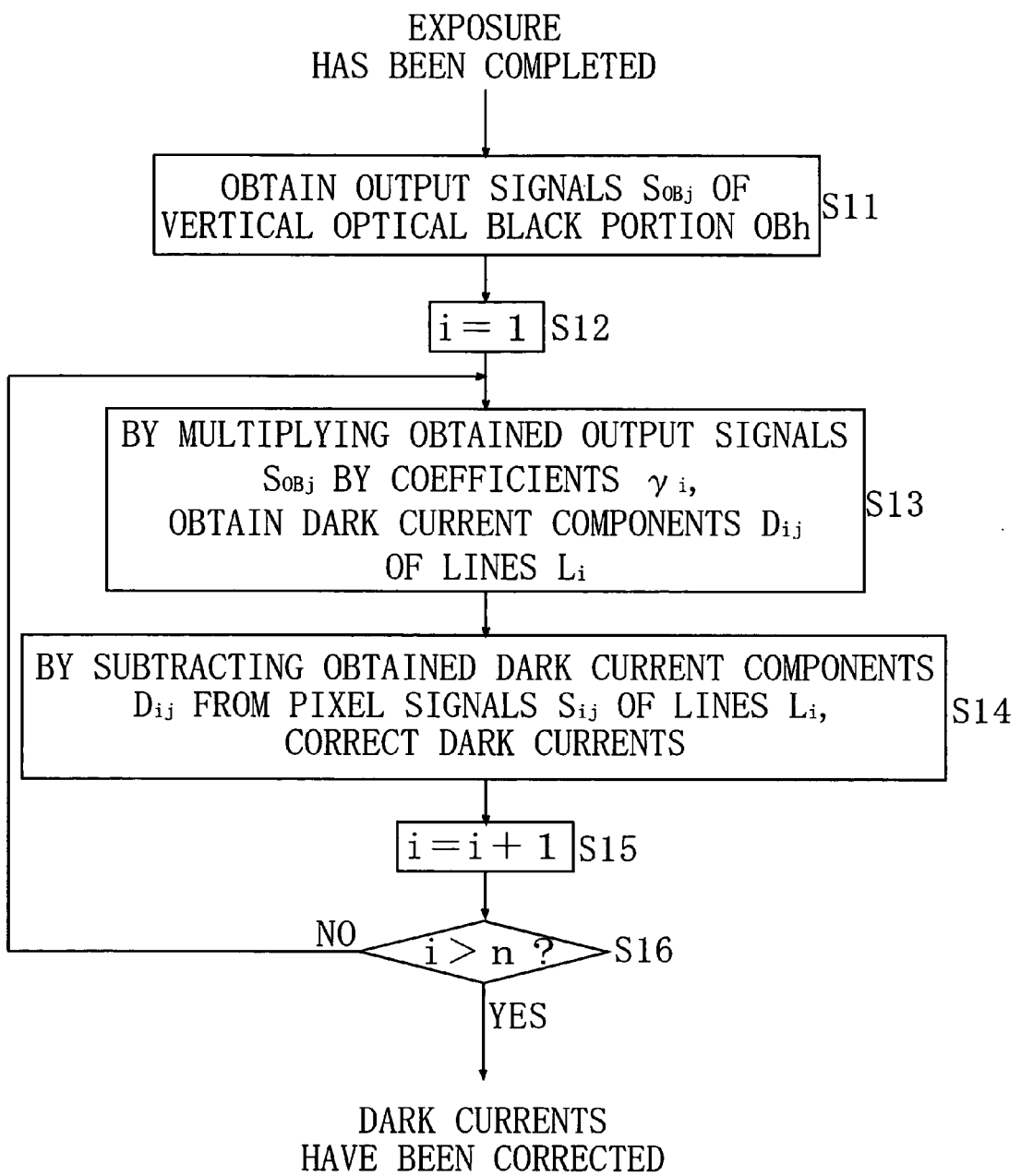
FIG. 5 is a flow chart showing an operation of the dark current correcting circuit 15.

FIG. 5 is a flow chart showing an operation of the dark current correcting circuit 15.

As shown in FIG. 4, the dark current correcting circuit 15 includes an operating circuit 15a, a line memory 15b, a look-up table (LUT) 15c, and an adder 15d. The look-up table 15c corresponds to the storage unit of the present invention. The operating circuit 15a and the line memory 15b correspond to the dark current obtaining unit of the present invention. The adder 15d corresponds to the correcting unit of the present invention.

The coefficients $y_i$ predetermined for the lines $L_i$ are correlated with the line numbers "i" of the lines $L_i$ and pre-stored in the look-up table 15c for the lines $L_i$ (i=1, . . . , n), respectively.

Each time the CCD imaging sensor 11 (refer to FIG. 1) has accumulated electric charges for one frame, the dark current correcting circuit 15 operates as follows.

As shown in FIG. 5, the dark current correcting circuit 15 receives output signals $S_{OB1}$, $S_{OB2}$, . . . , $S_{OBm}$ of the vertical optical black portion OBh that are first output from the CCD imaging sensor 11, and then stores them in the line memory 15b (at step S11).

With reference to the look-up table 15c, the operating circuit 15a of the dark current correcting circuit 15 reads the coefficient "$y_1$" correlated with the line number "1" of the top line $L_1$.

By multiplying the coefficient "$y_1$" by the respective signals $S_{OB1}$, $S_{OB2}$, . . . , $S_{OBm}$ stored in the line memory 15b (formula (1)), the operating circuit 15a obtains the dark current components $D_{11}$, $D_{12}$, . . . , $D_{1m}$ (step S13), respectively.

On the other hand, pixel signals $S_{11}$, $S_{12}$, . . . , $S_{1m}$ of the top line $L_1$ output from the CCD imaging sensor 11 subsequently to the output signals $S_{OB1}$, $S_{OB2}$, ..., $S_{OBm}$ of the vertical optical black portion OBh are sequentially input to the adder 15d.

By inputting inverted dark current components $D_{11}$, $D_{12}$, ..., $D_{1m}$ obtained by step S13 to the adder 15d, the operating circuit 15a subtracts the dark current components $D_{11}$, $D_{12}$, ..., $D_{1m}$ from the pixel signals $S_{11}$, $S_{12}$, ..., $S_{1m}$ (at step S14), respectively.

By the subtraction, the pixel signals $S_{11}$, $S_{12}$, ..., $S_{1m}$ of the top line L1 are corrected against the dark currents.

Thereafter, pixel signals $S_{21}$, $S_{22}$, ..., $S_{31}$, $S_{32}$, ... of the lines $L_2$, $L_3$, ... that are output from the CCD imaging sensor 11 are successively input to the dark current correcting circuit 15. The same processes of steps S13 and S14 are preformed for the lines $L_2$, $L_3$, ... as those for the top line $L_1$ (the flow advances to step S15 to step S16 No to step S13 to step S14 to step S15).

The dark current correction for one frame is completed after the last line $L_n$ has been processed (step S16 Yes).

As described above, the output signals $S_{OBj}$ (j=1, ..., m) of the vertical optical black portion OBh represent dark current components that locally occur on the CCD imaging sensor 11.

The dark current correcting circuit 15 according to the present embodiment pre-stores relations (in this case, coefficients $y_i$ (i=1, ..., n)) between the output signals $S_{OBj}$ (j=1, ..., m) and the dark current components $D_{ij}$ (i=1, ..., n, j=1, ..., m) (reference numeral 15c shown in FIG. 4). By multiplying the output signals $S_{OBj}$ (j=1, ..., m) by the coefficients $y_i$ (i=1, ..., n), the dark current correcting circuit 15 obtains the dark current components $D_{ij}$ (i=1, ..., n, j=1, ..., m) (step S13). Then, by subtracting the dark current components $D_{ij}$ (i=1, ..., n, j=1, ..., m) from the pixel signals $S_{ij}$ (i=1, ..., n, j=1, ..., m), the dark current correcting circuit 15 corrects the dark currents (step S14).

By the operation of the dark current correcting circuit 15, it reliably corrects dark current components that locally occur on the CCD imaging sensor 11 of the electronic camera 10 according to the present embodiment.

In addition, since the dark current correcting circuit 15 uses signals of the vertical optical black portion OBh that are read prior to signals of the top line $L_1$ of the effective pixel area 11a, the dark current correcting circuit 15 can correct the dark currents in real time.

Since the relations between the output signals $S_{OBj}$ (j=1, ..., m) and the dark current components $D_{ij}$ (i=1, ..., n, j=1, ..., m) are represented approximately by coefficients $y_i$ (i=1, ..., n), the dark current correcting circuit 15 is capable of obtaining the dark current components $D_{ij}$ (i=1, ..., n, j=1, ..., m) (step S13) by performing a simple calculation (in this case, multiplication).

In addition, since the dark current correcting circuit 15 according to the present embodiment only stores one coefficient y for each line, the size of the look-up table 15c becomes small.

Second Embodiment

Next, with reference to FIG. 1, FIG. 6, FIG. 7, and FIG. 8, a second embodiment of the present invention will be described. Likewise the first embodiment, the second embodiment is directed to an electronic camera according to the present invention. In the following description, only points different from those of the first embodiment will be described, and thus the description of the redundant portions will be omitted.

As shown in FIG. 1, the electronic camera 20 according to the second embodiment has a dark current correcting circuit 25 instead of the dark current correcting circuit 15 in the electronic camera 10 of the first embodiment.

According to the first embodiment, as shown in FIG. 3, it is assumed that there are proportional relations between the curves $C_i$ (i=1, ..., n) of the respective dark current components $D_{ij}$ (j=1, ..., m) of the line $L_i$ and the curves $C_{OB}$ of the respective output signals $S_{OBj}$ (j=1, ..., m) of the vertical optical black portion OBh.

Figure 6:
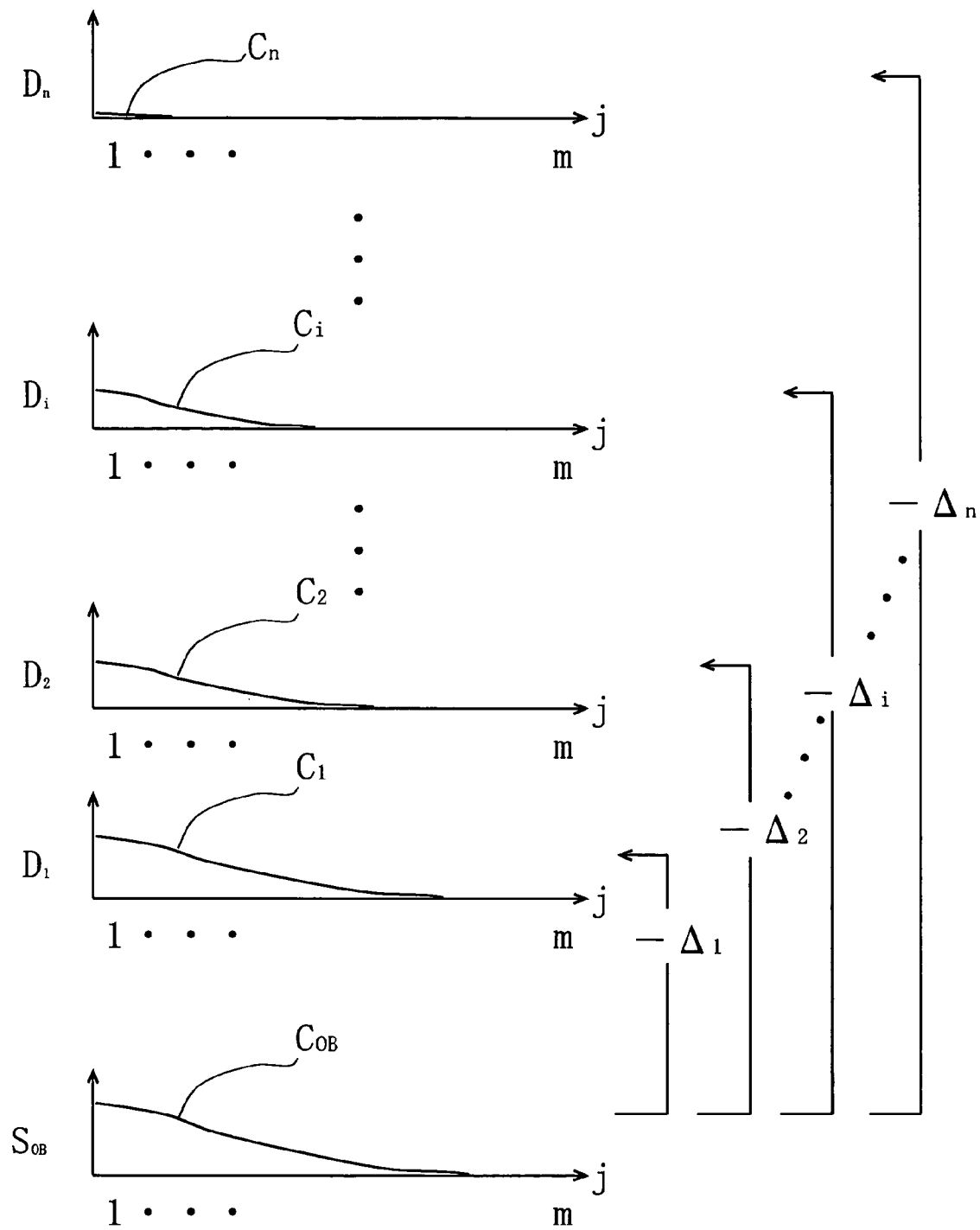
FIG. 6 is a schematic diagram describing a characteristic of the second embodiment of the present invention.

In the second embodiment, as shown in FIG. 6, it is assumed that differences between the curves $C_i$ (i=1, ..., n) of the respective dark current components $D_{ij}$ (j=1, ..., m) of the line $L_i$ and the curves COB of the respective output signals $S_{OBj}$ (j=1, ..., m) of the vertical optical black portion OBh are constant.

In this case, with the output signals $S_{OBj}$ (j=1, ..., m) and the subtraction values $\Delta_i$ predetermined for the line $L_i$, the dark current components $D_{ij}$ (j=1, ..., m) of the lines $L_i$ can be obtained by the following formula (2).

$$D_{ij} = S_{OBj} - \Delta_i (j=1, ..., m) \qquad (2)$$

Figure 7:
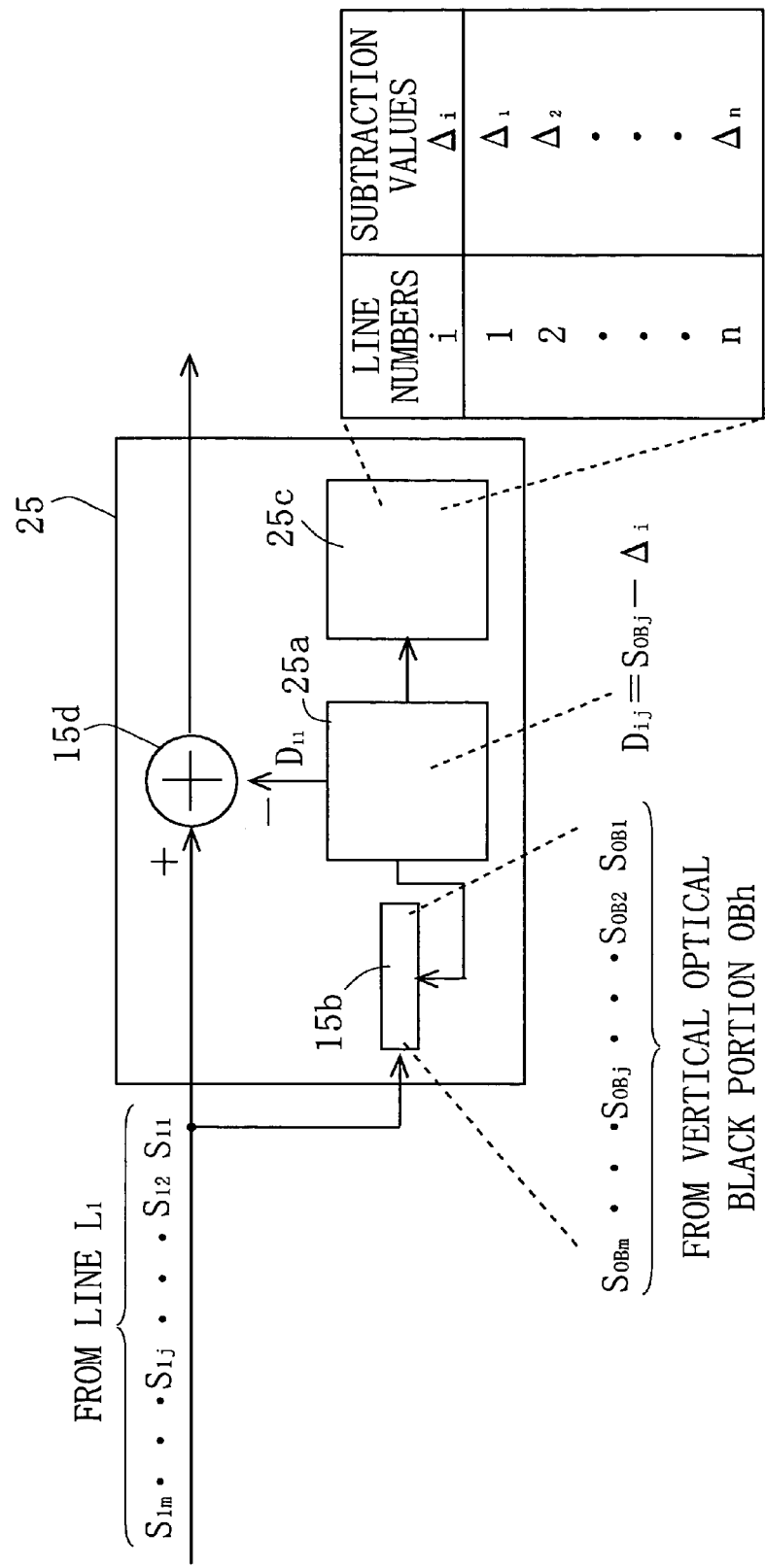
FIG. 7 is a schematic diagram showing a structure of a dark current correcting circuit 25.

FIG. 7 is a schematic diagram showing a structure of the dark current correcting circuit 25.

Figure 8:
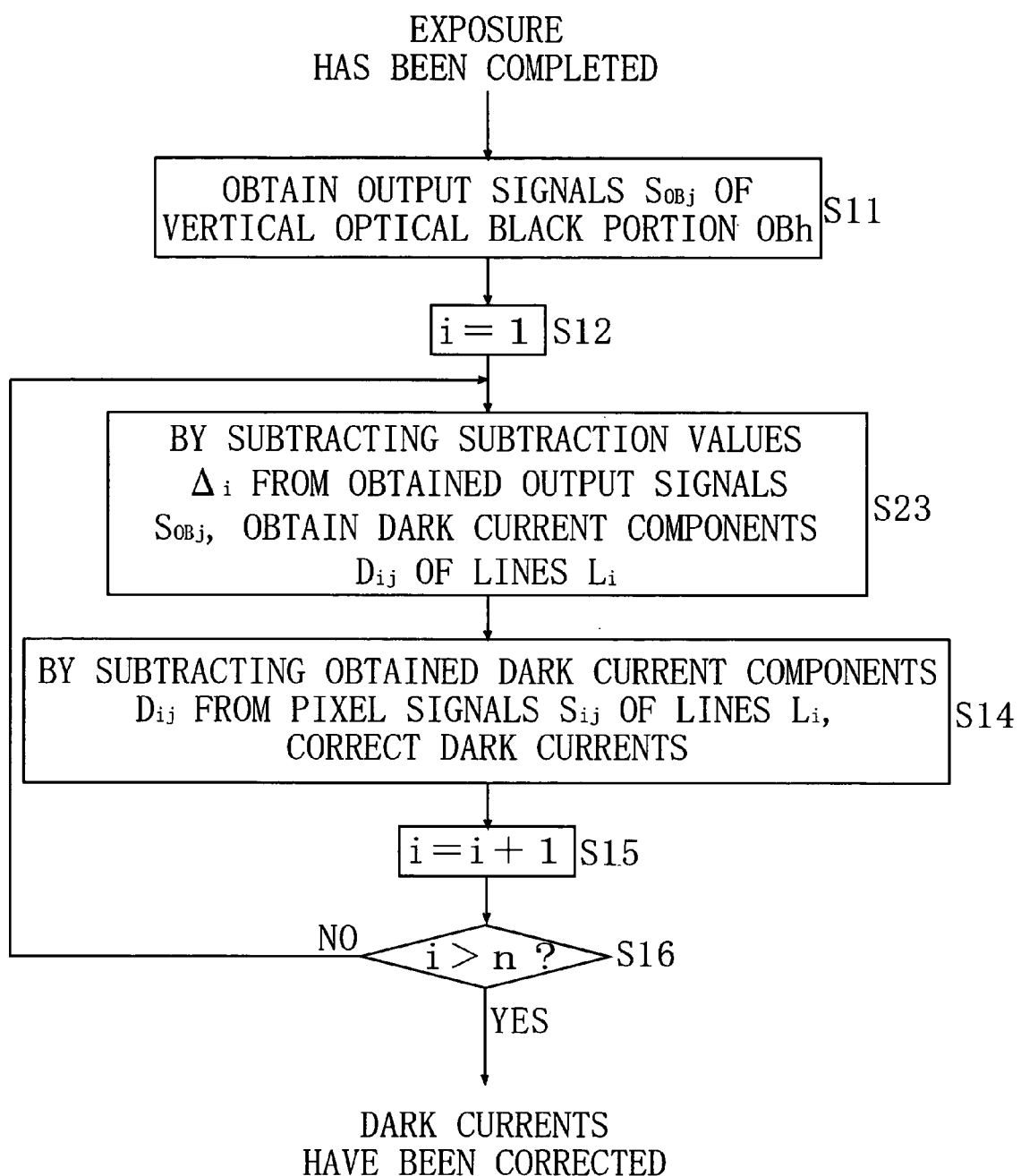
FIG. 8 is a flow chart showing an operation of the dark current correcting circuit 25.

FIG. 8 is a flow chart showing an operation of the dark current correcting circuit 25.

As shown in FIG. 7, the dark current correcting circuit 25 includes an operating circuit 25a and a look-up table 25c instead of the operating circuit 15a and the look-up table 15c, respectively, in the dark current correcting circuit 15 of the first embodiment as shown in FIG. 4.

The look-up table 25c pre-stores the subtraction values $\Delta i$ predetermined for the lines $L_i$ (i=1, ..., n) and correlated with the line numbers "i" of the lines $L_i$, respectively.

The flow chart of FIG. 8 shows an operation of the dark current correcting circuit 25. In the flow chart shown in FIG. 8, step S23 is executed instead of step S13 in the flow chart shown in FIG. 5.

At step S23, with reference to the look-up table 25c, the operating circuit 25a reads the subtraction values $\Delta_i$ correlated with the line numbers "i" of the lines $L_i$. In addition, by subtracting the subtraction values $\Delta i$ from the signals $S_{OB1}$, $S_{OB2}$, ..., $S_{OBm}$ stored in the line memory 15b (formula (2)), the operating circuit 25a obtains the dark current components $D_{i1}$, $D_{i2}$, ..., $D_{im}$, respectively.

In other words, the dark current correcting circuit 25 according to the present embodiment pre-stores the subtraction values $\Delta i$ (i=1, ..., n) as the relations between the output signals $S_{OBj}$ (j=1, ..., m) and the dark current components $D_{ij}$ (i=1, ..., n, j=1, ..., m) (reference numeral 25c shown in FIG. 7). In addition, by subtracting the subtraction values $\Delta_i$ (i=1, ..., n) from the output signals $S_{OBj}$ (j=1, ..., m), the dark current correcting circuit 25 obtains the respective dark current components $D_{ij}$ (i=1, ..., n, j=1, ..., m) (step S23). Moreover, by subtracting the dark current components $D_{ij}$ (i=1, ..., n, j=1, ..., m) from the pixel signals $S_{ij}$ (i=1, ..., n, j=1, ..., m), the dark current correcting circuit 25 corrects the dark currents (step S14).

Thus, the dark current correcting circuit 25 according to the present embodiment is different from the dark current correcting circuit 15 according to the first embodiment in that the former pre-stores "subtraction values $\Delta_i$ (i=1, ..., n)" as the information pre-stored therein and obtains the dark current components by a subtraction.

However, the dark current correcting circuit 25 according to the present embodiment has the same characteristic as the dark current correcting circuit 15 according to the first embodiment in that they use the output signals $S_{OB}$ of the vertical optical black portion OBh representing dark current components that locally occur on the CCD imaging sensor 11.

Thus, likewise the electronic camera 10 according to the first embodiment, the electronic camera 20 according to the present embodiment is capable of reliably correcting the dark current components that locally occur on the CCD imaging sensor 11.

In addition, since the dark current correcting circuit 25 according to the present embodiment uses signals of the vertical optical black portion OBh that are read before the top line $L_1$ of the effective pixel area 11a, the dark current correcting circuit 25 is capable of correcting the dark currents in real time.

In addition, since the relations between the output signals $S_{OBj}$ (=1, . . . , m) and the dark current components $D_{ij}$ (i=1, . . . , n, j=1, . . . , m) are approximately represented by the subtraction values $\Delta_i$ (i=1, . . . , n), the dark current correcting circuit 25 according to the present embodiment is capable of obtaining the dark current components $D_{ij}$ (i=1, . . . , n, j=1, . . . , m) (step S23) by performing a simple calculation (in this case, subtraction).

In addition, the dark current correcting circuit 25 according to the present embodiment only stores one subtraction value $\Delta$ for one line of the effective pixel area 11a. Thus, the size of the look-up table 25c becomes small.

Third Embodiment

Next, with reference to FIG. 1, FIG. 2, FIG. 9, FIG. 10, and FIG. 11, the third embodiment of the present invention will be described.

Likewise the foregoing first and second embodiments, the third embodiment is directed to an electronic camera according to the present invention. In the following description, only points different from those of the first or second embodiment will be described and thus the description of the redundant portions will be omitted.

As shown in FIG. 1, the electronic camera 30 according to the third embodiment has a dark current correcting circuit 35 instead of the dark current correcting circuit 15 of the electronic camera 10 according to the first embodiment.

According to the first embodiment or the second embodiment, it is assumed that there are specific relations between the curves $C_i$ (i=1, . . . , n) of the respective dark current components $D_{ij}$ (i=1, . . . , n, j=1, . . . , m) of the lines $L_i$ and the curves $C_{OB}$ of the respective output signals $S_{OBj}$ (j=1, . . . , m) of the vertical optical black portion OBh.

However, according to the first embodiment and the second embodiment, since these specific relations approximately represents real relations, respectively, corrected dark currents contain some errors even though the sizes of the look-up tables 15c and 25b become small.

In contrast, the dark current correcting circuit 35 according to the present embodiment is structured so that the primary importance is put on the correcting accuracy of the dark current.

Since the influence of generated heat radially spreads as shown in FIG. 2(b), dark current components superimposed on pixel signals of pixels having the same distance from the FDA 11b, which is a heat source, become equal.

Figure 9:
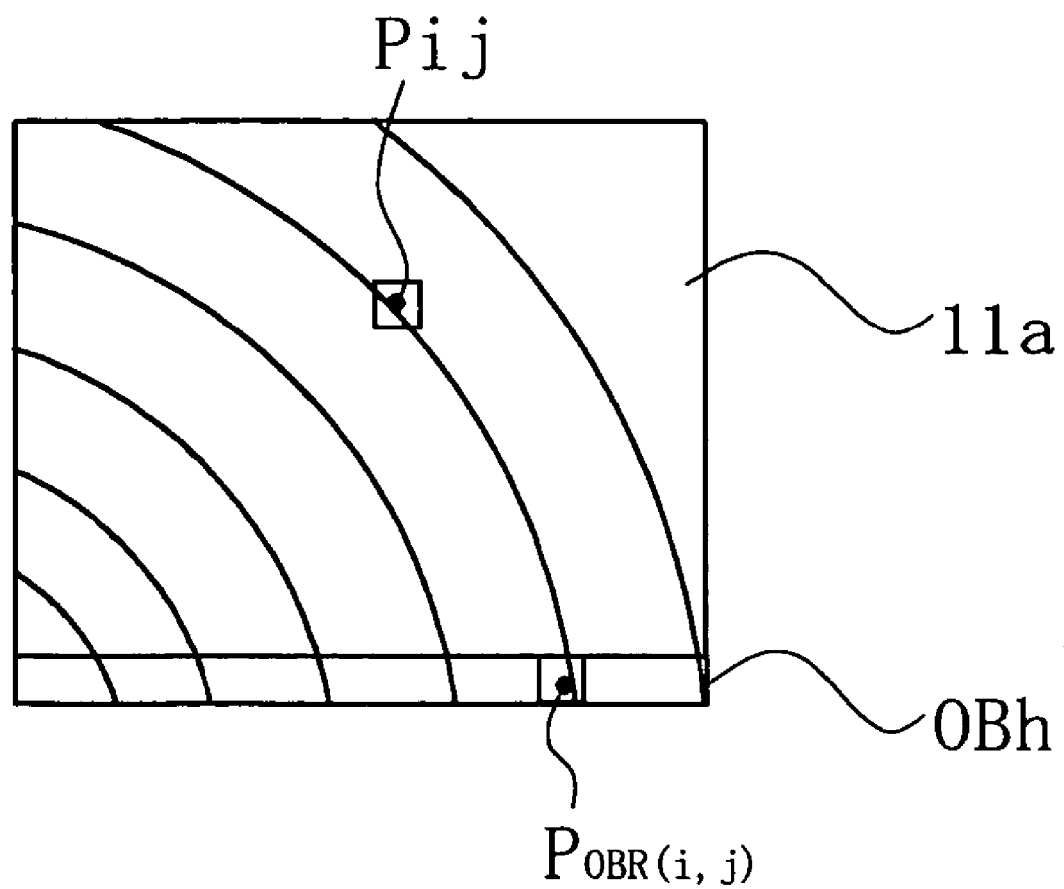
FIG. 9 is a schematic diagram showing pixels whose dark current components are equal in value.

FIG. 9 shows curves that connect pixels whose dark current components are equal.

The dark current components $D_{ij}$ of the effective pixels $P_{ij}$ in the effective pixel area 11a are equal to the dark current components of the optical black pixels $P_{OBR\,(i,j)}$ at the positions R (i, j) which are at the same distances from the effective pixels $P_{ij}$ and the FDA 11b, respectively, in the vertical optical black portion OBh.

Thus, with reference to the output signals $S_{OBR\,(i,j)}$ of the optical black pixels $P_{OBR\,(i,j)}$ at the positions R (i, j) which are at the same distances from the effective pixels $P_{ij}$ and the FDA 11b, respectively, in the vertical optical black portion OBh, the dark current components $D_{ij}$ of the effective pixels $P_{ij}$ can be obtained.

In other words, with the output signals $S_{OBj}$ (j=1, . . . , m) and the reference positions R (i, j) predetermined for the effective pixels $P_{ij}$, the dark current components $D_{ij}$ of the effective pixels $P_{ij}$ can be obtained by the following formula (3).

$$D_{ij}=S_{OBR\,(i,j)}(j=1,\ldots,m) \quad (3)$$

Figure 10:
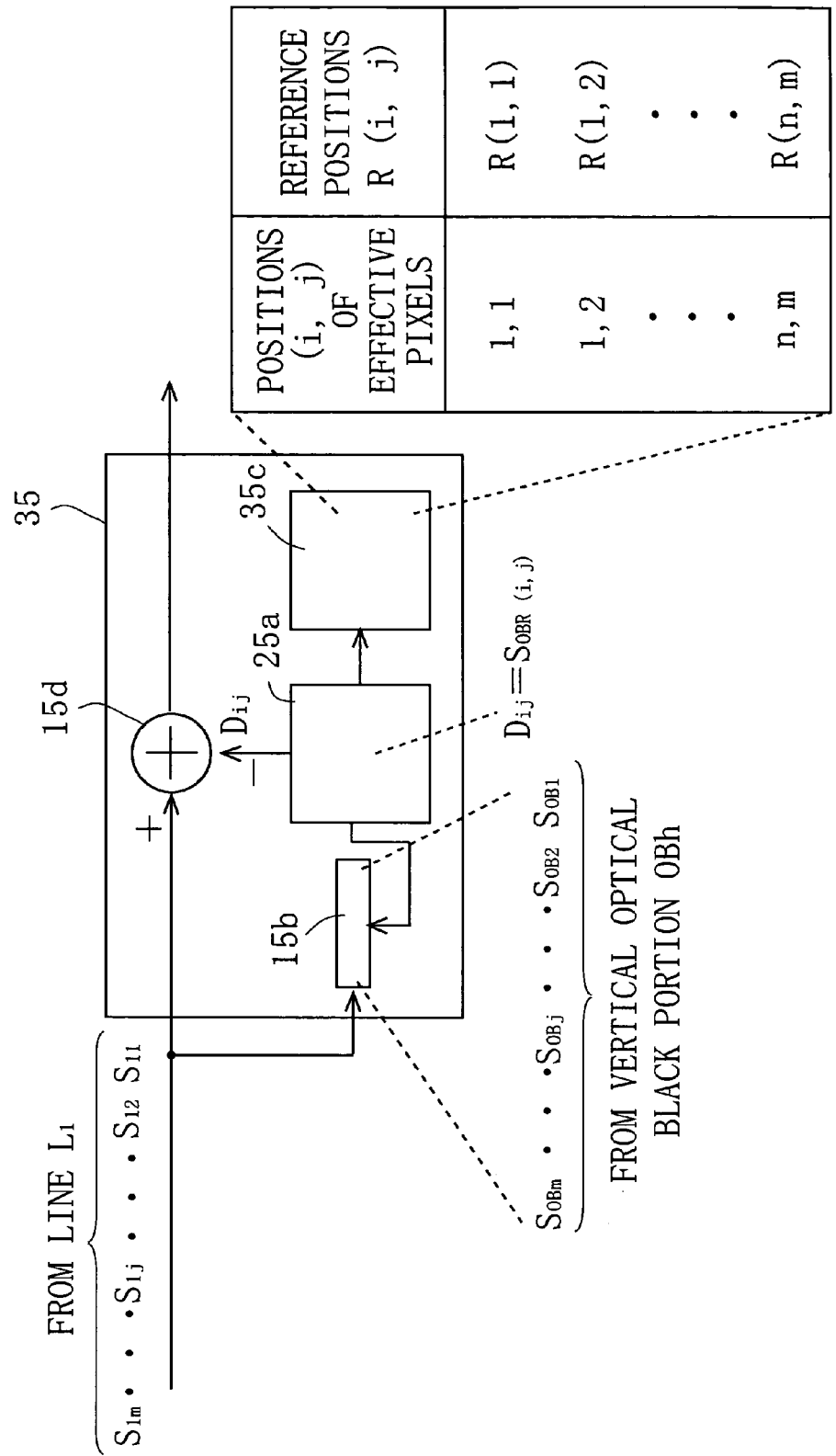
FIG. 10 is a schematic diagram showing a structure of a dark current correcting circuit 35.

FIG. 10 is a schematic diagram showing a structure of the dark current correcting circuit 35.

Figure 11:
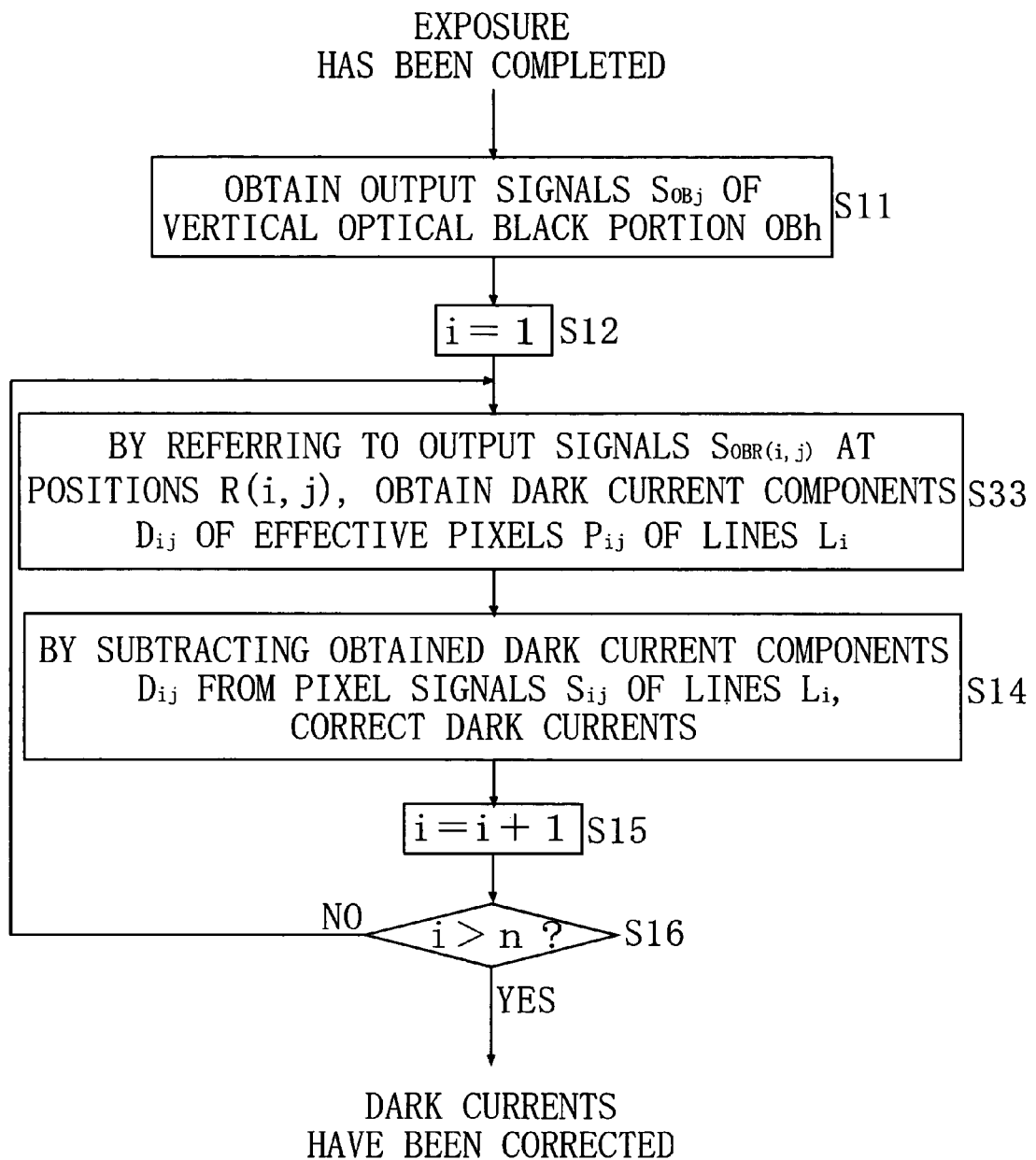
FIG. 11 is a flow chart showing an operation of the dark current correcting circuit 35.

FIG. 11 is a flow chart showing an operation of the dark current correcting circuit 35.

As shown in FIG. 10, the dark current correcting circuit 35 includes an operating circuit 35a and a look-up table 35c instead of the operating circuit 15a and the look-up table 15c of the dark current correcting circuit 15 according to the first embodiment as shown in FIG. 4.

In the look-up table 35c, the reference positions R (i, j) predetermined for the effective pixels $P_{ij}$ are correlated with the pixel positions "i, j" of the respective effective pixels $P_{ij}$, and pre-stored for the effective pixels $P_{ij}$ (i=1, . . . , n, j=1, . . . , respectively.

The flow chart of FIG. 11 shows an operation of the dark current correcting circuit 35. In this chart, the following step S33 is executed instead of step S13 in the flow chart shown in FIG. 5.

At step S33, with reference to the look-up table 35c, the operating circuit 35a reads the reference positions "R (i, 1)" correlated with the positions "i, 1" of the top pixels $P_{i1}$ of the line $L_i$.

In addition, with reference to the signals $S_{OBR(i,\,1)}$ of the optical black pixels $P_{OBR(i,\,1)}$ at the reference positions R (i, 1) from the line memory 15b, the operating circuit 35a obtains the dark current components $D_{i1}$ (formula (3)).

Likewise, the operating circuit 35a reads the reference positions R (i, 2), R (i, 3), . . . correlated with the successive effective pixels $P_{i2}$, $P_{i3}$, . . . from the look-up table 35c. Thereafter, with reference to the signals $S_{OBR\,(i,\,2)}$, $S_{OBR\,(i,\,3)}$, . . . of the optical black pixels $P_{OBR\,(i,\,2)}$, $P_{OBR\,(i,\,3)}$, . . . at the reference positions R (i, 2), R (i, 3), . . . from the line memory 15b (formula (3)), the operating circuit 35a obtains the dark current components $D_{i2}$, $D_{i3}$, . . . (step S33).

In other words, the dark current correcting circuit 35 according to the present embodiment pre-stores the reference positions R (i, j) (i=1, . . . , n, j=1, . . . , m) as the relations between the output signals $S_{OBj}$ (j=1, . . . , m) and the dark current components $D_{ij}$ (i=1, . . . , n, j=1, . . . , m) (reference numeral 35c shown in FIG. 10). In addition, with reference to the output signals $S_{OBR\,(i,\,j)}$ of the optical black pixels $P_{OBR\,(i,\,j)}$ at the reference positions R (i, j) (i=1, . . . , n, j=1, . . . , m), the dark current correcting circuit 35 obtains the respective dark current components $D_{ij}$ (i=1, . . . , n, j=1, . . . , m) (step S33). Further, by subtracting the dark current components $D_{ij}$ (i=1, . . . , n, j=1, . . . , m) from the pixel signals $S_{ij}$ (i=1, . . . , n, j=1, . . . , m), the dark current correcting circuit 35 corrects the dark currents (step S14).

Thus, since the dark current correcting circuit 35 according to the present embodiment pre-stores information of respective effective pixels, the size of the look-up table 35c becomes large. However, since the information is not the approximation of the relations between the dark current components $D_{ij}$ and the output signals $S_{OBj}$ but "reference positions R (i, j) (i=1, . . . , n, j=1, . . . , m)", the accuracy of the corrected dark current is high.

In addition, since the dark current correcting circuit 35 uses signals of the vertical optical black portion OBh that are read prior to that of the top line $L_1$ of the effective pixel area 11a, the dark current correcting circuit 35 is capable of correcting the dark currents in real time.

Others

Since the electronic cameras according to the foregoing embodiments reliably correct dark current components that locally occur, it is not necessary to suppress the bias current applied to the FDA of the CCD imaging sensor 11.

In addition, although the look-up tables 15c and 25c of the dark current correcting circuits 15 and 25 according to the first and second embodiments store relations (y, Δ) with the vertical optical black portion for respective lines, the look-up tables 15c and 25c can be structured as follows.

Namely, the look-up tables 15c and 25c store the relations (y, Δ) with the vertical optical black portion only for the top line, and for the rest of the lines, store the relations with their respective preceding lines. On the other hand, when obtaining the dark current components of the respective lines, the operating circuits 15a and 25a refer to the dark current components of the preceding lines.

In such a structure, since signals of the vertical optical black portion are referenced only when obtaining the dark current components of the top line, the line memory 15b can be omitted.

In addition, in the electronic camera 30 according to the third embodiment, the number of optical black pixels to be referenced by the dark current correcting circuit 35 is m (for one line of the effective pixel area). However, the number of optical black pixels to be referenced by the dark current correcting circuit 35 may be larger than for one line so as to improve the accuracy.

Further, in the above embodiments, although the dark current correcting circuits 15, 25, and 35 of the electronic cameras 10, 20, and 30 reference the signals of the vertical optical black portion, it is needless to say that they may reference output signals of other portion in the optical black area, such as a horizontal optical black portion. However, referring to the output signals of the vertical optical black portion is more favorable than referring to those of the other portion in the optical black area, since the dark current correcting circuits 15, 25, and 35 can correct the dark currents in real time.

Moreover, in the electronic cameras 10, 20, and 30 according to the foregoing embodiments, the dark current correcting circuits 15, 25, and 35 and the signal processing circuit 16 are structured as different circuits. Alternatively, a part of the signal processing circuit 16 may be modified so that it performs the same process as the dark current correcting circuits 15, 25, and 35.

In addition, according to the foregoing embodiments, electronic cameras equipped with a CCD imaging sensor are described as examples. However, the present invention can be also applied to electronic cameras equipped with other type of imaging sensor, such as a CMOS type imaging sensor.

The invention is not limited to the above embodiments and various modifications may be made without departing from the spirit and scope of the invention. Any improvement may be made in part or all of the components.

What is claimed is:

1. An imaging device, comprising:
    a storage unit which pre-stores information representing a relation between a dark current component being superimposed on a pixel signal of each of effective pixels and an output signal of each of optical black pixels, said effective pixels being arranged in a predetermined effective pixel area on an imaging sensor, and said optical black pixels being arranged in a predetermined optical black area which is a different area from said effective pixel area on the imaging sensor;
    a dark current obtaining unit which obtains dark current component superimposed on said pixel signals of each of said effective pixels based on both said information stored in said storage unit and the output signal of each of said optical black pixels; and
    a correcting unit which corrects said dark current component obtained by said dark current obtaining unit according to said pixel signal, wherein
    the information stored in said storage unit is information representing relations between the dark current component of each of said effective pixels on said effective pixel area and the output signal of one of said optical black pixels respectively arranged in corresponding position to that of each of said effective pixels on said optical black area.

2. The imaging device according to claim 1, wherein the information stored in said storage unit is information representing a ratio of said current component to said output signal every one of lines of said effective pixel area.

3. The imaging device according to claim 1, wherein the information stored in said storage unit is information representing a difference between said dark current component and said output signal every one of lines of said effective pixel area.

4. The imaging device according to claim 1, wherein the information stored in said storage unit is information representing a position of one of said optical black pixels in said optical black area every one of the effective pixels in said effective pixel area, the one of said optical black pixels outputting an output signal having a value equal to said dark current component.

5. The imaging device according to claim 1, wherein said optical black area is composed of the optical black pixel for at least one line from which the output signal is read prior to the pixel signals of the top line of said effective pixel area.

6. The imaging device according to claim 1, further comprising a heat source wherein, the information stored in said storage unit is information representing a coordination of each of said effective pixels on said effective pixel area and one of said optical black pixels on optical black area respectively having a same distance from said heat source to that of each of said effective pixels.

* * * * *